United States Patent
Takamoto et al.

(10) Patent No.: US 7,635,638 B2
(45) Date of Patent: Dec. 22, 2009

(54) COMPOUND SEMICONDUCTOR DEVICE EPITAXIAL GROWTH SUBSTRATE, SEMICONDUCTOR DEVICE, AND MANUFACTURING METHOD THEREOF

(75) Inventors: Tatsuya Takamoto, Nara (JP); Takaaki Agui, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/976,863

(22) Filed: Oct. 29, 2007

(65) Prior Publication Data

US 2008/0070388 A1 Mar. 20, 2008

Related U.S. Application Data

(62) Division of application No. 11/220,908, filed on Sep. 8, 2005, now abandoned.

(30) Foreign Application Priority Data

Sep. 9, 2004 (JP) ............................ 2004-262854

(51) Int. Cl.
H01L 21/46 (2006.01)
(52) U.S. Cl. ..................... 438/458; 438/459; 438/478
(58) Field of Classification Search ................ 438/458, 438/459, 478
See application file for complete search history.

(56) References Cited

U.S. PATENT DOCUMENTS

| 4,774,194 A | | 9/1988 | Hokuyou |
| 5,773,355 A | * | 6/1998 | Inoue et al. ................. 438/459 |
| 6,037,242 A | | 3/2000 | Hayafuji et al. |
| 6,778,573 B2 | * | 8/2004 | Hayakawa et al. ....... 372/43.01 |
| 6,790,695 B2 | * | 9/2004 | Ogihara et al. ................ 438/33 |
| 2001/0021212 A1 | | 9/2001 | Hayakawa et al. |
| 2001/0047751 A1 | | 12/2001 | Kim et al. |
| 2002/0195620 A1 | * | 12/2002 | Tanomura et al. ........... 257/197 |
| 2004/0108574 A1 | | 6/2004 | Hoke et al. |
| 2004/0185638 A1 | * | 9/2004 | Kakizaki et al. ............ 438/406 |
| 2005/0066880 A1 | * | 3/2005 | Furukawa et al. .............. 117/2 |

FOREIGN PATENT DOCUMENTS

| EP | 1 160 851 A2 | 12/2001 |
| JP | 52-083187 | 7/1977 |
| JP | 62-171167 | 7/1987 |
| JP | 09-232608 | 9/1997 |

(Continued)

OTHER PUBLICATIONS

Office Action mailed Jun. 28, 2007 for parent U.S. Appl. No. 11/220,908.

(Continued)

*Primary Examiner*—Long Pham
(74) *Attorney, Agent, or Firm*—Nixon & Vanderhye, PC

(57) ABSTRACT

A compound semiconductor device epitaxial growth substrate, wherein a semiconductor substrate, a substrate protective layer made of a material that is different from the material of the substrate, a middle layer for making separation of the semiconductor substrate and a compound semiconductor device layer possible, and a compound semiconductor device layer that is formed through epitaxial growth are layered in this order; and a semiconductor device which uses the compound semiconductor device layer that is gained by separating the semiconductor substrate, the substrate protective layer and the middle layer from this compound semiconductor device epitaxial growth substrate; as well as manufacturing methods for these.

20 Claims, 2 Drawing Sheets

FOREIGN PATENT DOCUMENTS

| | | |
|---|---|---|
| JP | 2000-252492 | 9/2000 |
| JP | 2000-277779 | 10/2000 |
| JP | 2001-257431 | 9/2001 |
| JP | 2005-019590 | 1/2005 |

OTHER PUBLICATIONS

Aspar et al., "Smart-Cut® Process Using Metallic Bonding: Application to Transfer of Si, GaAs, InP Thin Films", Electronic Letters, vol. 35, No. 12, Jun. 10, 1999, pp. 1024-1025.

Schermer et al, "High Rate Epitaxial Lift-off of InGaP Films From GaAs Substrates", Applied Physics Letters, vol. 76, No. 15, Apr. 10, 2000, pp. 2131-2133.

Voncken et al, "A Study of AlAs Etching in HF For Epitaxial Lift-off III-V Solar Cells", 19th European Photovoltaic Solar Energy Conference, Paris, France, Jun. 7-11, 2004, pp. 169-172.

EP Search Report mailed May 6, 2008 in corresponding EP applicaton 0501949.1.

Voncken et al, "Influence of Radius of Curvature on the Lateral Etch Rate of the Weight Induced Epitaxial Lift-off Process", Materials Science and Engineering B, Elsevier Sequoia, Lausanne, OH, vol. 95, No. 3, Sep. 1, 200, pp. 242-248.

Voncken et al., "Strain-Accelerated HF Etching of A1As for Epitaxial Lift-off", Journal of Physics: Condensed Matter, Institute of Physics Publishing, Bristol, GB, vol. 16, No. 21, Jun. 2, 2004, pp. 3585-3596.

\* cited by examiner

COMPOUND SEMICONDUCTOR DEVICE EPITAXIAL GROWTH SUBSTRATE, SEMICONDUCTOR DEVICE, AND MANUFACTURING METHOD THEREOF

This application is a divisional application of U.S. patent application Ser. No. 11/220,908 filed Sep. 8, 2005 now abandoned and is based on Japanese Patent Application No. 2004-262854 filed with the Japan Patent Office on Sep. 9, 2004, the entire contents of both of which are hereby incorporated by reference.

BACKGROUND OF THE TECHNOLOGY

1. Field of the Technology

The present technology relates to reduction in cost of a compound semiconductor device epitaxial growth substrate which is manufactured through epitaxial growth, and in particular, to reduction in cost of a semiconductor device such as a high efficiency multijunction-type compound solar cell. In addition, the present disclosure relates to reduction in cost of a semiconductor substrate that is used for epitaxial growth by reusing the substrate.

2. Description of the Background Art

For a semiconductor device with a large amount of epitaxial films having a large area, such as a solar cell, it is required that the material cost be as low as possible. The material cost of the substrate is large. Therefore, ideas for reducing the material cost by techniques such as reusing the substrate after peeling the substrate from the element have been put forth for a long time.

A conventional method of substrate reuse is known in which pores are formed in, for example, the surface of a substrate. Subsequently, an element layer is epitaxially grown, and a great number of voids which exist in the portion where the pores have been formed (middle layer) are cut through so as to mechanically separate the substrate from the element layer. According to this method, however, the pores remain on the surface of the substrate, and therefore, flattening or cleaning (e.g., through surface processing) becomes necessary.

In another conventional substrate removal method an atom displaced layer is formed in a portion that is extremely shallow from the surface of the substrate, by means of ion implantation. Subsequently, an element layer is epitaxially grown and the atom displaced layer (middle layer) is cut through so as to mechanically separate the substrate from the element layer, and thereby, the substrate is reused. According to this method, however, the surface of the substrate is damaged, and therefore, flattening or cleaning through surface processing becomes necessary Yet another conventional method of substrate removal involves epitaxially growing an element layer after a middle layer (that can be selectively etched) has been formed on the surface of the substrate. The middle layer is etched and removed, and thereby, the substrate and the element layer are separated from each other through chemical treatment. According to this method, however, a layer that has deteriorated due to a chemical change remains on the surface of the substrate, and therefore, flattening or cleaning through surface processing, again, becomes necessary.

As described above, the conventional technology for reusing a substrate has a problem in that the surface of the substrate becomes coarse or polluted after the separation, and requires processing for flattening or cleaning, such as polishing on the surface of the substrate, lapping or the like. Therefore, the cost increases, due to surface processing. In addition, a problem arisesin that the number of times that use is possible is reduced due to reduction in the thickness of the substrate, and thus the yield is reduced due to cracking of the substrate.

Example documents that disclose conventional technologies concerning the present technology include the following: Electron Lett. 35, p. 1024, by B. Asper et al. (1999), Appl. Phys. Lett. 76, p. 2131, by J Schermer et al. (2000) and $19^{th}$ European Photovoltaic Solar Energy Conference, 7-11, June 2004, Paris, France, p. 169-172 by M. M. A. J. Voncken et al. (2004).

The present technology is provided in order to solve the aforementioned problems. An object of the technology is to provide a compound semiconductor device epitaxial semiconductor growth substrate where an element layer can be formed through epitaxial growth again after the substrate and the element layer that has been epitaxially grown have been separated from each other without causing (1) an increase in the cost due to surface processing of the substrate, such as polishing or lapping, (2) a reduction in the number of times that use is possible due to reduction in the thickness of the substrate, or (3) reduction in the yield due to cracking of the substrate, as well as a semiconductor device that uses such a substrate, and a manufacturing method of the same.

BRIEF SUMMARY

A compound semiconductor device epitaxial growth substrate is characterized in that a semiconductor substrate, a substrate protective layer made of a material that is different from the material of the substrate, a middle layer for making separation of the semiconductor substrate and a compound semiconductor device layer possible, and a compound semiconductor device layer that is formed through epitaxial growth are layered in this order.

In accordance with this compound semiconductor device epitaxial growth substrate, the element layer and the semiconductor substrate can be separated at the middle layer, and thereby, a semiconductor substrate where a flat and clean surface is maintained can be gained, by removing the substrate protective layer on the semiconductor substrate after the separation.

It is preferable for the aforementioned substrate protective layer to be removable through etching with an etching selection ratio of no less than 80% against the semiconductor substrate.

In addition, it is preferable for the aforementioned substrate protective layer to lattice match with the semiconductor substrate.

In addition, it is preferable for the aforementioned middle layer to be made of a material that can be etched with a liquid or a gas which does not etch the substrate or the element layer.

It is preferable for the aforementioned semiconductor substrate to be GaAs and for the substrate protective layer to be $In_{0.5}Ga_{0.5}P$, $(AlGa)_{0.5}In_{0.5}P$ or $Al_xGa_{1-x}As$ (x>0.3) in the compound semiconductor device epitaxial growth substrate.

Also provided is a semiconductor device which uses a compound semiconductor device layer that is gained by separating the semiconductor substrate, the substrate protective layer and the middle layer from the aforementioned compound semiconductor device epitaxial growth substrate.

The technology also provides a manufacturing method of a compound semiconductor device epitaxial growth substrate that includes the steps of: removing a middle layer from a compound semiconductor device epitaxial growth substrate where a semiconductor substrate, a substrate protective layer made of a material that is different from the material of the substrate, a middle layer for making the separation of the semiconductor substrate and a compound semiconductor device layer possible, and a compound semiconductor device layer that is formed through epitaxial etching are layered in this order so as to separate the semiconductor substrate and the compound semiconductor device layer; removing the substrate protective layer through etching so as to expose the surface of the semiconductor substrate; and sequentially growing a substrate protective layer, a middle layer and a compound semiconductor device layer on the exposed semiconductor substrate.

In addition, the technology provides a manufacturing method of a semiconductor device, characterized in that a semiconductor device is manufactured using a compound semiconductor device layer that is gained in accordance with the aforementioned manufacturing method of a compound semiconductor device epitaxial growth substrate.

The foregoing and other objects, features, aspects and advantages will become more apparent from the following detailed description when taken in conjunction with the accompanying drawings.

DESCRIPTION OF THE PREFERRED EMBODIMENTS

Figure 1:
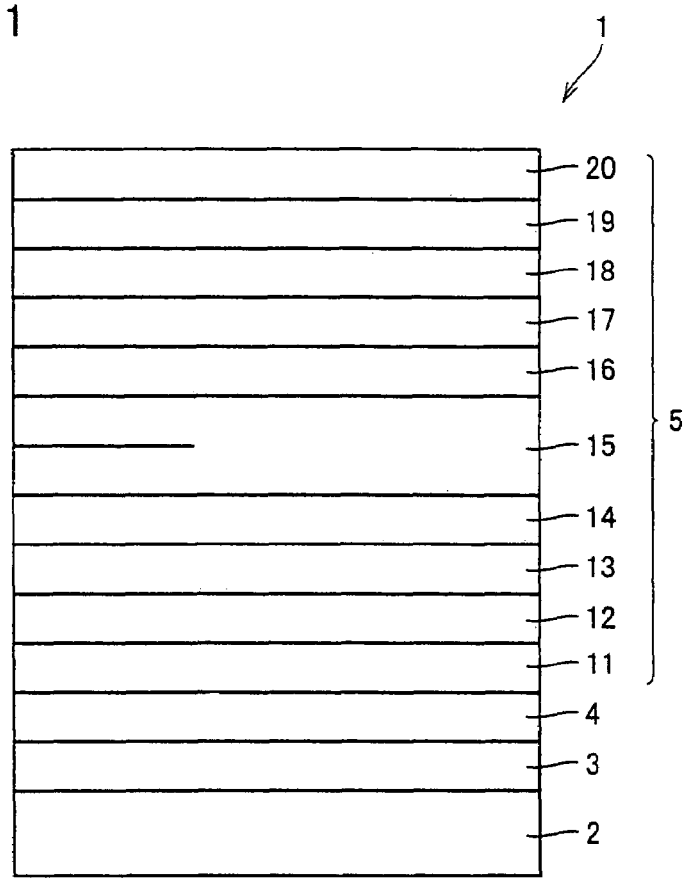
FIG. 1 is a diagram schematically showing a compound semiconductor device epitaxial growth substrate 1 according to one example embodiment.

FIG. 1 is a diagram schematically showing a compound semiconductor device epitaxial growth substrate 1 according to one example embodiment. Compound semiconductor device epitaxial growth substrate 1 has a basic structure where a substrate protective layer 3, a middle layer 4 and a compound semiconductor device layer (element layer) 5 are sequentially layered on a semiconductor substrate 2. "Upward direction" of the substrate indicates the direction upward, as opposed to downward, along the thickness of the substrate. "Semiconductor device" in the present specification includes a compound semiconductor device, and as a specific example, a solar cell (e.g., a multijunction solar cell where a single or a number of solar batteries from among a GaAs solar cell, an InGaAs solar cell, an InGaP solar cell, an AlInGaP solar cell and an InGaNAs solar cell are connected to each other through tunnel junctions) and the like.

As for semiconductor substrate 2, conventional materials that have been widely used in the present field can be used without particular limitation as the material for forming the semiconductor substrate. GaAs, Ge, InP, sapphire, Si and the like can be cited as examples of the material for forming this semiconductor substrate 2. In particular, GaAs is preferable, because this allows high quality layers with a low crystal defect density to lattice match and grow for the formation of a high efficiency solar cell element.

Though the thickness of semiconductor substrate 2 is not particularly limited, it is preferable for it to be 100 μm to 10000 μm, and it is more preferable for it to be 300 μm to 1000 μm. In the case where the thickness of semiconductor substrate 2 is less than 100 μm, the substrate tends to easily warp during growth and easily break during handling, whereas in the case where the thickness exceeds 10 000 μm, support of the substrate within the device for growth tends to become complicated or heavy, making it difficult to handle.

Substrate protective layer 3 comprises a material that is different from that of the aforementioned semiconductor substrate 2, and it is preferable for the material to be removable through etching with an etching selection ratio of no less than 80% (more preferably, no less than 98%) against semiconductor substrate 2. Such an etching selection ratio makes it possible for only substrate protective layer 3 on semiconductor substrate 2 to be efficiently removed through etching after the separation of substrate protective layer 3 and compound semiconductor device epitaxial element layer 5 in accordance with the below described manufacturing method, whereby, semiconductor substrate 2 having a flat and clean surface is maintained can easily be collected and reused for the manufacture of a compound semiconductor device epitaxial growth substrate.

In addition, it is preferable for substrate protective layer 3 to lattice match semiconductor substrate 2. This is because, in the case where substrate protective layer 3 lattice matches semiconductor substrate 2, no atomic layers from the surface of the substrate to the vicinity of the protective layer warp, and thus little damage is caused to the surface of the substrate. Consequently, the number of times of reuse of the substrate can be increased.

The material that forms substrate protective layer 3 is not particularly limited, as long as it is different from that of the aforementioned semiconductor substrate 2, and InGaP, AlGaInP, AlGaAs, GaAsP and the like can be cited as examples when a GaAs substrate is used. In particular, $In_{0.5}Ga_{0.5}P$, $(AlGa)_{0.5}In_{0.5}P$ and $Al_xGa_{1-x}As$ (x>0.3) are preferable, because they lattice match the substrate and have an etching selection ratio of no less than 80%.

It is preferable for the thickness of substrate protective layer 3 to be 0.01 μm to 2 μm, and it is more preferable for it to be 0.05 μm to 0.5 μm. This is because in the case where the thickness of substrate protective layer is less than 0.01 μm, the layer is too thin and tends to partially peel during etching, whereas in the case where the thickness exceeds 2 μm, the cost of epitaxial growth tends to increase.

Middle layer 4 is formed between substrate protective layer 3 and element layer 5 in order to make the separation of semiconductor substrate 2 and element layer 5 possible, in accordance with the below described manufacturing method. It is preferable to form the middle layer of a material which can be etched with a liquid or a gas that does not etch the substrate, the protective layer, or the element layer. AlAs, $Al_xGa_{1-x}As$ (x>0.5), InGaP, AlInGaP and the like can be cited as examples of this material, in the case where the substrate is formed of an appropriate material selected from the above, and the element layer is formed of an appropriate material that is selected from below. In particular, AlAs, $Al_xGa_{1-x}As$ (x>0.5), $In_{0.5}Ga_{0.5}P$ and $(AlGa)_{0.5}In_{0.5}P$ are preferable. As for the liquid or gas for etching, a hydrofluoric acid based solution, a hydrochloric acid based solution, a sulfuric acid based solution, an ammonium based solution, a potassium hydroxide based solution, a chlorine based gas, a fluorine based gas and the like can be cited as examples.

It is preferable for the thickness of middle layer 4 to be 0.003 μm to 2 μm, and it is more preferable for it to be 0.005 μm to 0.1 μm. This is because in the case where the thickness of middle layer 4 is less than 0.003 μm, a region where the middle layer is not formed tends to form within the surface of the substrate, whereas in the case where the thickness exceeds 2 μm, the amount of etching increases and the etching rate tends to decrease.

The material of element layer 5 is not particularly limited, as long as it comprises one or more layers which are formed on the aforementioned middle layer 4 through epitaxial growth and can be formed of a conventionally known appropriate material in accordance with the application. It is preferable for element layer 5 to have a two-layer structure where the two layers are connected via a tunnel junction in the structures of the rear surface electrical field layer, the base layer, the emitter layer and the window layer, in order to gain a highly efficient solar cell. In element layer 5 of the example shown in FIG. 1, a p-InGaP layer, which is a rear surface electrical field layer 11, a p-GaAs layer, which is a base layer 12, an n-GaAs layer, which is an emitter layer 13, and an AlInP layer, which is a window layer 14, are formed as the first layer structure. In addition, a p-AlInP layer, which is a rear surface electrical field layer 16, a p-InGaP layer, which is a base layer 17, an n-InGaP layer, which is an emitter layer 18, and an AlInP layer, which is a window layer 19, are formed as the second layer structure on top of the first layer structure with an InGaP layer and an AlGaAs layer, which make up a tunnel junction layer 15, in between. Furthermore, an n-GaAs layer, which is a contact layer 20, is formed as the topmost surface layer. An appropriate thickness of each layer can be selected within a preferable range, in accordance with the function thereof. The layered structure of element layer 5 shown in FIG. 5 is, of course, illustrative, and element layer 5 is not limited to this.

Compound semiconductor device epitaxial growth substrate 1 is provided with substrate protective layer 3 made of a material that is different from the material of the substrate, and formed on semiconductor substrate 2 and middle layer 4 for making the separation of substrate 2 and element layer 5 possible, which are sequentially layered between semiconductor substrate 2 and compound semiconductor device layer 5, as described above. This compound semiconductor device epitaxial growth substrate 1 allows element layer 5 and semiconductor substrate 2 to be separated at middle layer 4, and thereby, semiconductor substrate where a flat and clean surface is maintained can be gained, by removing substrate protective layer 3 on semiconductor substrate 2 after the separation.

Compound semiconductor device epitaxial growth substrate 1 provided with the aforementioned structure can be manufactured in accordance with, for example, the following procedure.

First, a vertical type MOCVD device is used to sequentially grow and layer substrate protective layer 3 and middle layer 4 on semiconductor substrate 2. In the case where, for example, a GaAs substrate is used as semiconductor substrate 2, an InGaP layer is formed as substrate protective layer 3, and an AlAs layer is formed as middle layer 4. TMI (trimethyl indium), TMG and $PH_3$ (phosphine) can be used as the materials for the growth of the InGaP layer, and in addition, TMA (trimethyl aluminum) and $AsH_3$ (arsine) can be used as the materials for the growth of the AlAs layer.

Furthermore, element layer 5 is epitaxially grown on top of this. In the case where element layer 5 which has a layered structure as in the example shown in FIG. 1 is formed, a p-InGaP layer, which is rear surface electrical field layer 11, a p-GaAs layer, which is base layer 12, an n-GaAs layer, which is emitter layer 13, and a AlInP layer, which is window layer 14, are formed as the first layer structure. In addition, a p-AlInP layer, which is rear surface electrical field layer 16, a p-InGaP layer, which is base layer 17, an n-InGaP layer, which is emitter layer 18, an AlInP layer, which is window layer 19, and an n-GaAs layer, which is contact layer 20, are sequentially formed and layered on top of the first layer structure as the second layer structure, with an InGaP layer and an AlGaAs layer, which make up tunnel junction layer 15, in between. TMI (trimethyl indium), TMG (trimethyl gallium) and $PH_3$ (phosphine) can be used as the materials for the growth of the InGaP layers, and TMG and $AsH_3$ (arsine) can be used as the materials for the growth of the GaAs layers, in the same manner as in the above. In addition, TMA (trimethyl aluminum), TMI and $PH_3$ can be used as the materials for the growth of the AlInP layers. $SiH_4$ (mono-silane) can be used as an impurity for the formation of n-type layers, and DEZn can be used as an impurity for the formation of p-type layers during the growth of all of the GaAs layers, InGaP layers and AlInP layers. In addition, TMI, TMG and $AsH_3$ can be used as the materials, and $CBr_4$ (carbon tetrabromide) can be used as a p-type impurity for the growth of the AlGaAs layer that forms the tunnel junction. In this manner, the compound semiconductor device epitaxial growth substrate 1 having a structure as in the example shown in FIG. 1 can be manufactured.

It is preferable for the temperature for growing layers other than the tunnel junction layer to be within a range from 600° C. to 700° C., in order to increase the lifetime of minor carriers, while it is preferable for the temperature for growing the tunnel junction layer to be within a range from 500° C. to 600° C., in order to prevent re-vaporization of the impurity, so that the impurity can be doped at a high concentration.

Figure 2:
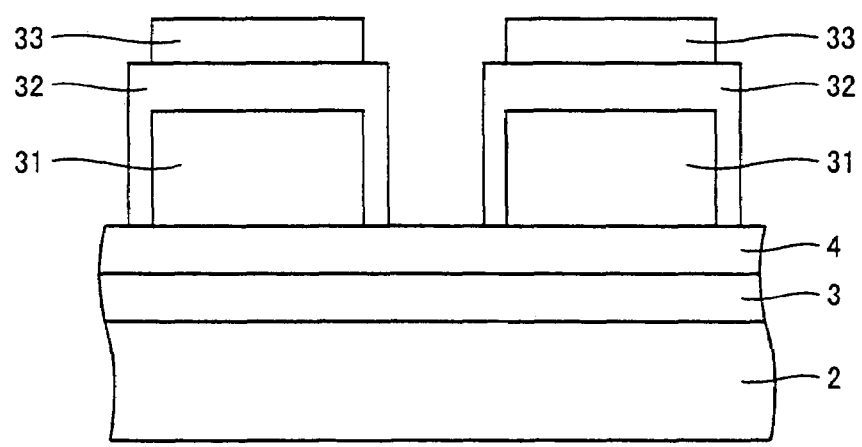
FIG. 2 is a diagram illustrating a manufacturing method of a compound semiconductor device epitaxial growth substrate according to an example embodiment.
Figure 3:
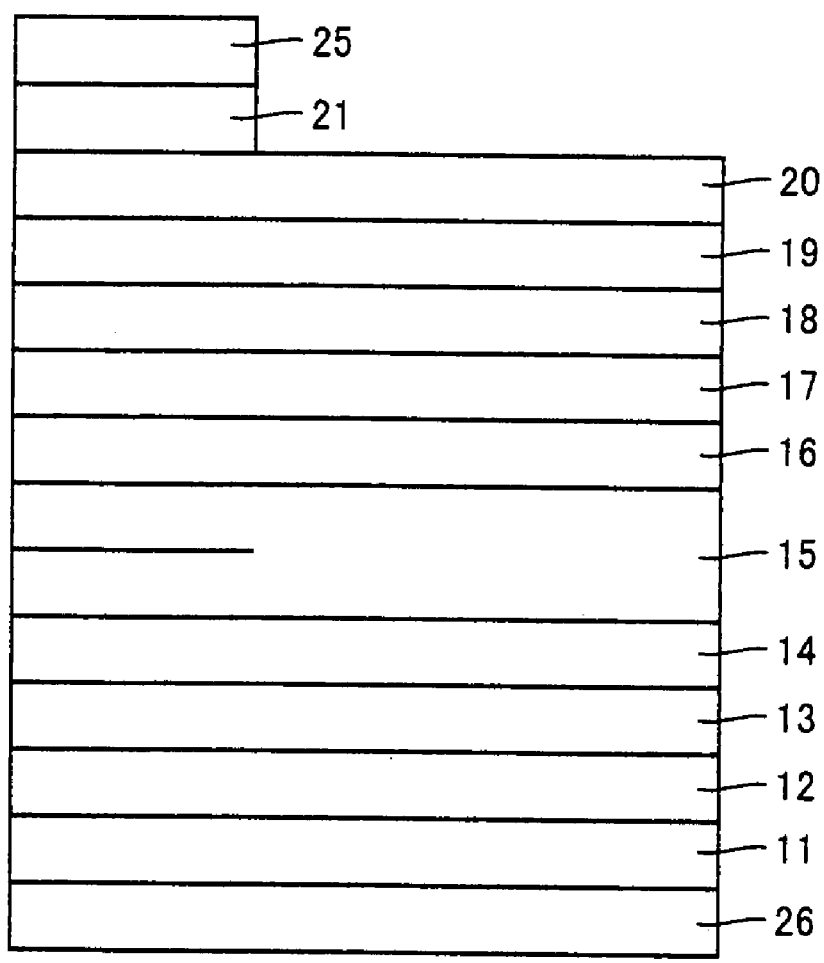
FIG. 3 is a diagram schematically showing a solar cell that is gained in accordance with a manufacturing method according to an example embodiment.

FIG. 2 is a diagram illustrating a manufacturing method of a compound semiconductor device epitaxial growth substrate, and FIG. 3 is a diagram schematically showing a solar cell as one example of a semiconductor device that is gained in accordance with the manufacturing method of the present technology. The present technology also provides a manufacturing method of a compound semiconductor device epitaxial growth substrate that includes the steps of: removing middle layer 4 from compound semiconductor device epitaxial growth substrate 1 which is provided with semiconductor substrate 2, substrate protective layer 3 made of a material that is different from the material of the substrate and formed on semiconductor substrate 2, and compound semiconductor device layer 5 that is formed on substrate protective layer 3 through epitaxial growth, and which further has middle layer 4 for making the separation of substrate 2 and element layer 5 possible between substrate protective layer 3 and compound semiconductor device layer 5, so that the semiconductor substrate and the compound semiconductor device layer are separated; removing the substrate protective layer through etching so that the surface of semiconductor substrate 2 is exposed; and sequentially growing substrate protective layer 3, middle layer 4 and compound semiconductor device layer 5 on the exposed semiconductor substrate 2.

Prior to implementing the manufacturing method of a compound semiconductor device epitaxial growth substrate, a process is carried out on element layer 5 of compound semiconductor device epitaxial growth substrate 1 having, for example, a structure as shown in FIG. 1, that has been prepared as described above so that a cell precursor (precursor of a solar cell) is formed. First, a GaAs layer 21 is formed on contact layer 20 of compound semiconductor device epitaxial growth substrate 1 shown in FIG. 1, and after that, a surface electrode 25 having a desired pattern is formed. In the formation of surface electrode 25, first, a resist where windows are created in a desired electrode pattern form in accordance with a photolithographic method, for example, is applied, and the substrate is placed in a vacuum vapor deposition device so as to form a resist, and after that, a layer (for example, 100 nm) made of Au that includes 12% of Ge, for example, is formed in accordance with a resistance heating method, and then, an Ni layer (for example, 20 nm) and an Au layer (for example, 5000 nm) are sequentially formed in accordance with an EB vapor deposition method, and thus, the electrode is formed with a desired pattern in accordance with, for example, a lift-off method.

Next, surface electrode 25 is used as a mask, and the portion of GaAs layer 21 where surface electrode 25 is not formed is etched using, for example, an alkaline solution. Subsequently, a resist with windows opened in a mesa-etching pattern is formed in accordance with a photolithographic method, and the epitaxial layer in the portions where windows are open is etched with an alkaline solution and an acid solution, so that middle layer 4 is exposed (element layer 5 that remains after etching and where surface electrode 25 is formed is referred to as "cell precursor 31").

Next, support substrates 33 made of plastic are made to adhere to cell precursors 31 after wax 32 has been applied to the surface of cell precursors 31, so as to form the structure shown in FIG. 2. Apiezon wax, for example, is appropriate for use as wax 32. In addition, plates formed of glass, ceramics or Si having high chemical proof properties, for example, can be used as support substrates 33. Support substrates 33 can be made adherent using, for example, a removable wax or resist.

The structure of FIG. 2 is formed in this manner, and after that, the aforementioned manufacturing method of a compound semiconductor device epitaxial growth substrate is implemented. Namely, in the initial step, middle layer 4 is first removed so that semiconductor substrate 2 and compound semiconductor device layer 5 (cell precursor 31 in the example shown in FIG. 2) are separated. The structure shown in FIG. 2 is immersed in a hydrofluoride solution, and thereby, removal of middle layer 4 can be carried out, by etching middle layer 4. Each cell precursor 31 after the separation can be formed into a structure (solar cell) as shown in FIG. 3, by forming electrode (rear surface electrode) 26 in accordance with a method such as vapor deposition, sputtering, electrolytic plating, non-electrolytic plating, ion plating, spraying, adhesion or printing, and after that, melting wax at a high temperature so as to separate the precursor from the support substrate, and then, immersing the precursor in an organic solvent so as to remove wax 32.

In the next step, substrate protective layer 3 is removed from semiconductor substrate 2 through etching, so that the surface of semiconductor substrate 2 is exposed. Semiconductor substrate 2 that is gained in this manner has a flat and clean substrate surface, unlike conventional substrates. As described above, substrate protective layer 3 is preferably selected so as to be removable through etching at an etching selection ratio of no less than 80% against the semiconductor substrate, and thereby, a flat and clean substrate surface can be easily gained without causing damage to the surface of the substrate. Etching of substrate protective layer 3 can be carried out with an appropriate etching solution under appropriate conditions, in accordance with the material that forms the substrate protective layer. In the case where, for example, an InGaP layer is used as substrate protective layer 3, as shown in FIG. 1, substrate protective layer 3 can be removed through etching, by immersing the substrate in an HCl solution.

After that, substrate protective layer 3, middle layer 4 and compound semiconductor device layer 5 are sequentially grown on the exposed semiconductor substrate 2. At this time, it is preferable to provide several nm or more of the same material as the substrate as a buffer layer between the substrate and the substrate protective layer in a conventional process through epitaxial growth. Before carrying out this step, it is preferable to rinse semiconductor substrate 2 with ultra pure water, and after that, dry it by means of $N_2$ blowing. In addition, in a conventional process, before the epitaxial growth, it is preferable to etch the substrate by approximately several nm from the surface of the substrate with the solution with which the substrate is etched. The formation of substrate protective layer 3, middle layer 4 and compound semiconductor device layer 5 may be carried out in the same manner as described above. Compound semiconductor device epitaxial growth substrate 1 having a structure as shown in FIG. 1 is manufactured again using semiconductor substrate 2 that has been collected as described above. According to the manufacturing method of a compound semiconductor device epitaxial growth substrate, this cycle is repeated, so that semiconductor substrate 2 is reused many times, and thereby, solar cells as shown in FIG. 3 can be manufactured.

As described above, the present technology also provides a semiconductor device (for example, a solar cell as that shown in FIG. 3) which uses a compound semiconductor device layer that is gained by separating the semiconductor substrate, the substrate protective layer, and the middle layer from the compound semiconductor device epitaxial growth substrate.

In addition, the present technology also includes a manufacturing method of a semiconductor device, characterized in that a semiconductor device is manufactured using a compound semiconductor device using that is gained in accordance with the aforementioned manufacturing method of a compound semiconductor device epitaxial growth substrate.

EXAMPLES

The present technology is more concretely described by the following non-exhaustive examples.

Example 1

First, the layer structure shown in FIG. 1 was fabricated on an n-type GaAs substrate, which is semiconductor substrate 2, by means of an MOCVD method. That is to say, a GaAs substrate ($1E18$ $cm^{-3}$, Si doped) having a diameter of 50 mm was placed in a vertical type MOCVD device, and first, 0.1 μm of a $In_{0.5}Ga_{0.5}P$ layer was formed as substrate protective layer 3. Subsequently, 0.02 μm of an AlAs layer was formed as middle layer 4 for the separation through etching, 0.1 μm of an InGaP layer was grown, for stopping etching, and layers were sequentially grown for a solar cell layer structure, and thus, element layer 5 was formed.

The temperature for growth was 700° C., and TMG (trimethyl gallium) and $AsH_3$ (arsine) were used as the materials for the growth of the GaAs layers. TMI (trimethyl indium), TMG and $PH_3$ (phosphine) were used as the materials for the growth of the InGaP layers. $SiH_4$ (mono-silane) was used as an impurity for the formation of an n-type layer, and DEZn was used as an impurity for the formation of a p-type layer during the growth of all of GaAs, InGaP and AlInP layers. TMI, TMG and $AsH_3$ were used as the materials for the growth of the AlGaAs layer that forms the tunnel junction, where $CBr_4$ (carbon tetrabromide) was used as a p-type impurity.

A resist where windows were open for an electrode pattern was formed on the contact layer (n-type GaAs layer) on the surface of the epitaxial layer in accordance with a photolithographic method, the substrate was placed in a vacuum vapor deposition device, so that a layer (100 nm) made of Au that contains 12% of Ge was formed on the formed resist in accordance with a resistance heating method, and after that, an Ni layer (20 nm) and an Au layer (5000 nm) were sequentially formed in accordance with an EB vapor deposition method. After that, a surface electrode in a desired pattern was formed in accordance with a lift-off method. Next, the surface electrode was used as a mask, and the portion of the GaAs contact layer where the electrode was not formed was etched with an alkaline solution.

Subsequently, a resist with windows opened in a mesa etching pattern was formed in accordance with a photolithographic method, and the portions of the epitaxial layer where the windows were open were etched with an alkaline solution and an acid solution, so that the AlAs layer, which is middle layer 4, was exposed.

Next, wax was applied and a plastic plate was made to adhere to the light receiving surface of the cell, excluding the mesa etching portion, so that a cross sectional structure as that shown in FIG. 2 was fabricated. After that, the wafer was immersed in an Hf solution, and the AlAs middle layer beneath the cell layer was etched and removed from the mesa etching portion, and thereby, the cell layer and the substrate were separated. After that, an electrode was formed on the rear surface of each cell, and then, the wax was removed, so that a solar cell was completed in the first process, so as to have a structure as that shown in FIG. 3. The size of the cell was 10 mm×10 mm, and 12 cells were fabricated from a substrate having a diameter of 50 mm.

After that, the InGaP layer, which is substrate protective layer 3, formed on the substrate side, was removed through etching with HCl, so that the surface of the GaAs substrate was exposed. The substrate was rinsed with ultra pure water, and after that, dried through $N_2$ blowing, placed into the MOCVD device again, and the structure of FIG. 1 was again epitaxially grown. The above described process was carried out again, and a solar cell was completed in the second process, so as to have the same structure as that shown in FIG. 2.

Evaluation of cell characteristics was carried out with a solar simulator which radiates AM 1.5 G standard solar beams, so as to measure the current voltage characteristics at the time of radiation of the beams, and the short circuit current, the open voltage and the conversion efficiency were measured. Table 1 shows a comparison of various characteristics between the cells that were fabricated in the first and second processes.

TABLE 1

|  | Voc(V) | Isc(mA) | F.F. | Eff(%) |
|---|---|---|---|---|
| FIRST PROCESS | 2.41 | 13.7 | 0.85 | 28.2 |
| SECOND PROCESS | 2.42 | 13.6 | 0.85 | 28.2 |

Characteristics which were essentially the same as those of the cells of the first process were gained in the cells of the second process, which were fabricated on the reused substrate, and thus, it was confirmed that substrates can be reused effectively.

Although the present technology has been described and illustrated in detail, it is clearly understood that the same is by way of illustration and example only and is not to be taken by way of limitation, the spirit and scope of the present technology being limited only by the terms of the appended claims.

What is claimed is:

1. A method of manufacturing a semiconductor device, comprising:

forming a substrate protective layer on a semiconductor substrate, wherein the substrate protective layer is formed of a material that is different from the material of the substrate;

forming a middle layer on the substrate protective layer;

forming a compound semiconductor device on the middle layer, wherein at least a portion of the compound semiconductor device is formed via epitaxial growth;

separating the compound semiconductor device from the semiconductor substrate and the substrate protective layer by etching the middle layer; and removing any remaining portion of the middle layer and the protective layer from the semiconductor substrate, via etching, to form a new semiconductor substrate.

2. The method of claim 1, further comprising repeating the forming and separating steps using the new semiconductor substrate that is obtained in the removing step.

3. The method of claim 1, wherein the substrate protective layer is formed on the semiconductor substrate via epitaxial growth.

4. The method of claim 3, wherein the middle layer is formed on the substrate protective layer via epitaxial growth.

5. The method of claim 1, wherein the substrate protective layer is formed of a material having an etching selection ratio of at least 80% relative to the semiconductor substrate.

6. The method of claim 1, wherein the substrate protective layer is formed of a material having an etching selection ratio of at least 95% relative to the semiconductor substrate.

7. The method of claim 1, wherein the material of the semiconductor substrate and the material of the substrate protective layer result in a lattice match between the semiconductor substrate and the substrate protective layer.

8. The method of claim 1, wherein the middle layer is formed of a material that can be etched with a liquid or a gas that does not substantially etch the compound semiconductor device or the semiconductor substrate.

9. The method of claim 8, wherein the middle layer is formed of a material that can be etched with a liquid or a gas that does not substantially etch the substrate protective layer.

10. The method of claim 1, further comprising etching portions of the compound semiconductor device to expose selected portions of the middle layer which are located between a plurality of individual semiconductor device precursor regions before performing the separating step.

11. The method of claim 10, further comprising attaching support substrates to the semiconductor device precursor regions after the etching step and before the separating step.

12. The method of claim 11, wherein the separating step results in the plurality of individual semiconductor device precursor regions being separated from each other, and from the semiconductor substrate, and further comprising forming an electrode structure on bottom surfaces of the plurality of separated semiconductor device precursor regions.

13. The method of claim 11, further comprising forming an electrode structure on the top surface of the compound semiconductor device before performing the etching step.

14. The method of claim 13, wherein the separating step results in the plurality of individual semiconductor device precursor regions being separated from each other, and from the semiconductor substrate, to thereby form a plurality of semiconductor devices, and further comprising removing the support substrates from the plurality of semiconductor devices.

15. The method of claim 11, wherein the support substrates are attached to the plurality of semiconductor device precursor regions via a wax adhesive.

16. The method of claim 15, wherein the separating step results in the plurality of individual semiconductor device precursor regions being separated from each other, and from the semiconductor substrate, to thereby form a plurality of semiconductor devices, and further comprising:
heating the plurality of semiconductor devices to melt the wax and thereby remove the support substrates from the plurality of semiconductor devices; and
immersing the plurality of semiconductor devices in an organic solvent to remove any wax remaining on the plurality of semiconductor devices.

17. The method of claim 1, wherein the compound semiconductor device comprises a two layer structure, and wherein the two layers are connected via a tunnel junction.

18. A method of forming a plurality of semiconductor devices, comprising:
   a. forming a substrate protective layer on a semiconductor substrate;
   b. forming a middle layer on the substrate protective layer;
   c. forming a compound semiconductor device structure on the middle layer, wherein at least a portion of the compound semiconductor device structure is formed via epitaxial growth, and wherein the compound semiconductor device structure includes a plurality of semiconductor device precursors;
   d. separating the compound semiconductor device structure from the semiconductor substrate and the substrate protective layer by etching the middle layer;
   e. removing any remaining portion of the middle layer and the protective layer from the semiconductor substrate, via etching, to form a new semiconductor substrate; and
   f. repeating steps a.-d. using the new semiconductor substrate that results from step e.

19. The method of claim 18, further comprising selectively etching the compound semiconductor device structure to separate the compound semiconductor device structure into a plurality of semiconductor device precursors after performing step c, and before performing step d.

20. The method of claim 18, wherein the substrate protective layer and the middle layer are formed via epitaxial growth.

* * * * *